(12) United States Patent
Wirz et al.

(10) Patent No.: US 11,670,612 B2
(45) Date of Patent: Jun. 6, 2023

(54) METHOD FOR SOLDER BRIDGING ELIMINATION FOR BULK SOLDER C2S INTERCONNECTS

(71) Applicant: Micron Technology, Inc., Boise, ID (US)

(72) Inventors: Brandon P. Wirz, Boise, ID (US); Benjamin L. McClain, Boise, ID (US); Jeremy E. Minnich, Boise, ID (US); Zhaohui Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 195 days.

(21) Appl. No.: 17/176,095

(22) Filed: Feb. 15, 2021

(65) Prior Publication Data

US 2021/0183802 A1    Jun. 17, 2021

Related U.S. Application Data

(62) Division of application No. 15/692,803, filed on Aug. 31, 2017, now abandoned.

(51) Int. Cl.
| | |
|---|---|
| *H01L 21/48* | (2006.01) |
| *H01L 23/00* | (2006.01) |
| *H01L 21/033* | (2006.01) |
| *H01L 21/60* | (2006.01) |

(52) U.S. Cl.
CPC .......... *H01L 24/17* (2013.01); *H01L 21/0337* (2013.01); *H01L 24/14* (2013.01);
(Continued)

(58) Field of Classification Search
CPC ...... H01L 2224/13101–92125; H01L 21/0337
See application file for complete search history.

(56) References Cited

U.S. PATENT DOCUMENTS

| | | | |
|---|---|---|---|
| 7,041,513 B2 | 5/2006 | Akram | |
| 7,569,935 B1 * | 8/2009 | Fan | .......... H01L 24/16 |
| | | | 257/737 |

(Continued)

FOREIGN PATENT DOCUMENTS

| | | |
|---|---|---|
| CN | 1574475 A | 2/2005 |
| CN | 103378041 A | 10/2013 |

(Continued)

OTHER PUBLICATIONS

CN Patent Application No. 201811006229.0—Chinese Office Action and Search Report, dated Nov. 22, 2021, with English Translation, 23 pages.

*Primary Examiner* — Hoa B Trinh
(74) *Attorney, Agent, or Firm* — Perkins Coie LLP

(57) ABSTRACT

A semiconductor device assembly that includes a semiconductor device positioned over a substrate with a number of electrical interconnections formed between the semiconductor device and the substrate. The surface of the substrate includes a plurality of discrete solder mask standoffs that extend towards the semiconductor device. A thermal compression bonding process is used to melt solder to form the electrical interconnects, which lowers the semiconductor device to contact and be supported by the plurality of discrete solder mask standoffs. The solder mask standoffs permit the application of a higher pressure during the bonding process than using traditional solder masks. The solder mask standoffs may have various polygonal or non-polygonal shapes and may be positioned in pattern to protect sensitive areas of the semiconductor device and/or the substrate. The solder mask standoffs may be an elongated shape that protects areas of the semiconductor device and/or substrate.

14 Claims, 5 Drawing Sheets

(52) U.S. Cl.
CPC .............. *H01L 24/81* (2013.01); *H01L 24/13* (2013.01); *H01L 24/16* (2013.01); *H01L 24/32* (2013.01); *H01L 24/73* (2013.01); *H01L 2021/60007* (2013.01); *H01L 2224/13101* (2013.01); *H01L 2224/16225* (2013.01); *H01L 2224/32225* (2013.01); *H01L 2224/73204* (2013.01); *H01L 2224/81024* (2013.01); *H01L 2224/81141* (2013.01); *H01L 2224/81191* (2013.01); *H01L 2224/81203* (2013.01); *H01L 2224/92125* (2013.01)

(56) References Cited

U.S. PATENT DOCUMENTS

| | | |
|---|---|---|
| 9,496,238 B2 | 11/2016 | Shu et al. |
| 10,276,539 B1 * | 4/2019 | Wirz ................ H01L 24/92 |
| 2004/0080049 A1 | 4/2004 | Kim et al. |
| 2004/0141298 A1 | 7/2004 | Harvey |
| 2005/0110164 A1 | 5/2005 | Pendse |
| 2006/0261446 A1 | 11/2006 | Wood et al. |
| 2007/0119911 A1 * | 5/2007 | Chan ...................... H05K 3/303 |
| | | 228/180.22 |
| 2009/0072385 A1 | 3/2009 | Mley et al. |
| 2013/0277828 A1 | 10/2013 | Huang et al. |
| 2014/0210074 A1 | 7/2014 | Chen et al. |
| 2015/0131249 A1 | 5/2015 | Marbella et al. |
| 2016/0118333 A1 | 4/2016 | Lin |
| 2017/0367180 A1 | 12/2017 | Schriel et al. |
| 2019/0067232 A1 | 2/2019 | Wirz et al. |

FOREIGN PATENT DOCUMENTS

| | | |
|---|---|---|
| CN | 104637906 A | 5/2015 |
| CN | 106104799 A | 11/2016 |

* cited by examiner

METHOD FOR SOLDER BRIDGING ELIMINATION FOR BULK SOLDER C2S INTERCONNECTS

RELATED APPLICATION

The present application is a divisional patent application of U.S. patent application Ser. No. 15/692,803 entitled Method for Solder Bridging Elimination for Bulk Solder C2S Interconnects filed on Aug. 31, 2017 and published on Feb. 28, 2019 as U.S. Patent App. Pub. No. 2019/0067232, which is incorporated by reference herein in its entirety.

FIELD

The embodiments described herein relate to semiconductor device assemblies having die support structures and methods of providing such semiconductor device assemblies. The present disclosure relates to discrete solder mask standoffs to support a semiconductor device, such as a die, on a substrate.

BACKGROUND

Semiconductor device assemblies, including, but not limited to, memory chips, microprocessor chips, and imager chips, typically include a semiconductor die mounted on a substrate, the semiconductor device assembly may be encased in a plastic protective covering or metal heat spreader. The semiconductor device assembly may include various functional features, such as memory cells, processor circuits, and imager devices, and may include bond pads that are electrically connected to the functional features of the semiconductor device assembly. The semiconductor device assembly may include semiconductor dies stacked upon and electrically connected to one another by individual interconnects between adjacent dies within a package. The individual interconnects may comprise a conductive material, such as solder, and a pair of contacts on opposing surfaces of adjacent dies of the semiconductor device assembly. Various methods and/or techniques may be employed to support and electrically interconnect adjacent dies and/or substrates in a semiconductor device assembly.

Thermal compression bonding with non-conductive film (NCF), otherwise known as wafer level underfill (WLUF), is a technique that may be used to connect a die to a substrate to create a semiconductor device assembly. Underfill material, which may be a laminated sheet of film, is deposited onto a wafer comprising multiple dies. The wafer may be diced to form individual dies that are then bonded to a substrate. One potential disadvantage of WLUF is the presence of voids due to the topography (e.g., copper traces, solder mask) of the substrate. For example, the topography may inhibit voids from flowing outside the die area. FIG. 5 shows a semiconductor device package 200 that includes a semiconductor device 210 bonded to a substrate 240 within a packaging material 290. The semiconductor device package 200 includes a solder mask 245 and NCF 270 positioned between the semiconductor device 210 and the substrate 240. The semiconductor device package 200 includes voids 246 within the NCF 270 adjacent to interconnects 280 between the semiconductor device 210 and the substrate 240. The voids 246 may have been created due to the topography of the interconnects 280. Interconnects 280 may comprise pillars 230 connected to electrical traces 250 via pads 260. For example, the topography of the interconnects 280 may inhibit a void from flowing outside of the area of the semiconductor device 210.

It may be desired to have a specific bond line between the semiconductor device 210 and the substrate 240. During the bonding process, the force applied during the bonding process may need to be varied in an attempt to obtain the specified bond line. For example, when the NCF material is at a high viscosity state a higher force may need to be applied to obtain the desired bond line, but as the NCF is heated during the TCB process the viscosity of the NCF may decrease so that less force is required to obtain the desired bond line. The change in viscosity during the TCB process, which in turn causes a variation in the applied force may make it difficult to consistently obtain the desired bond line for the duration of the process.

A higher force applied during the TCB process may help to eliminate the WLUF voids, but the higher applied force may cause solder to unintentionally bridge across traces and/or interconnects of the semiconductor device assembly as would be appreciated by one of ordinary skill in the art. Alternatively, the solder thickness may be reduced to help eliminate bridging, but a reduced solder thickness may lead to metastable intermetalic (IMC) issues as would be recognized by one of ordinary skill in the art.

TCB using flux and capillary underfill ("Flux/CUF") as a material is another technique that may be used to attach a die to a substrate to create a semiconductor device assemblies. The flux may be flux jetted onto a substrate and then a semiconductor device may be attached to the substrate using a TCB process. Afterwards, capillary underfill (CUF) may be dispensed next to the semiconductor bond line so that the capillary effect pulls the CUF into the bond line until it is full. The topography (e.g., copper traces, solder mask, outrigger pads) of the substrate may cause incomplete capillary flow across the desired surface of the substrate.

Additional drawbacks and disadvantages may exist.

Figure 1:
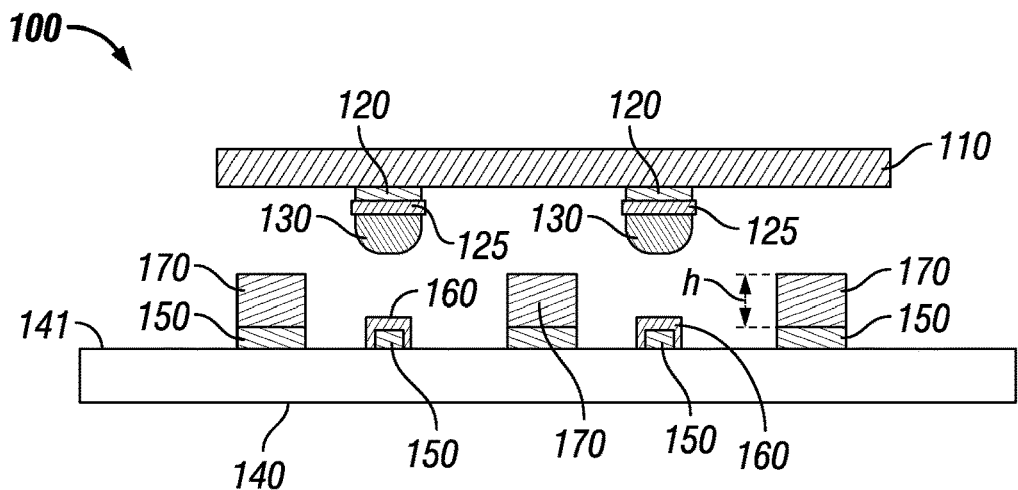
FIG. 1 is a schematic of an embodiment of a semiconductor device assembly comprised of a semiconductor device positioned above a substrate having a plurality of discrete solder mask standoffs.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise incorporate within the housing or casing.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, and methods of making and/or operating semiconductor devices. In one embodiment of the disclosure a semiconductor device is positioned above a substrate having a plurality of discrete solder mask standoffs that support the semiconductor on the substrate. The plurality of discrete solder mask standoffs permit a higher force to be applied as the semiconductor device is bonded to the substrate than the force able to be applied in traditional WLUF and/or Flux/CUF processes while minimizing bridging as discussed herein. The discrete solder mask standoffs may be strategically positioned in a pattern to better protect various sensitive portions of the semiconductor device and/or the substrate as discussed herein. The shape of the individual discrete solder mask standoffs may help protect various sensitive portions of the semiconductor device and/or substrate and/or may tend to direct the flow of solder melted during the bonding process.

Figure 3:
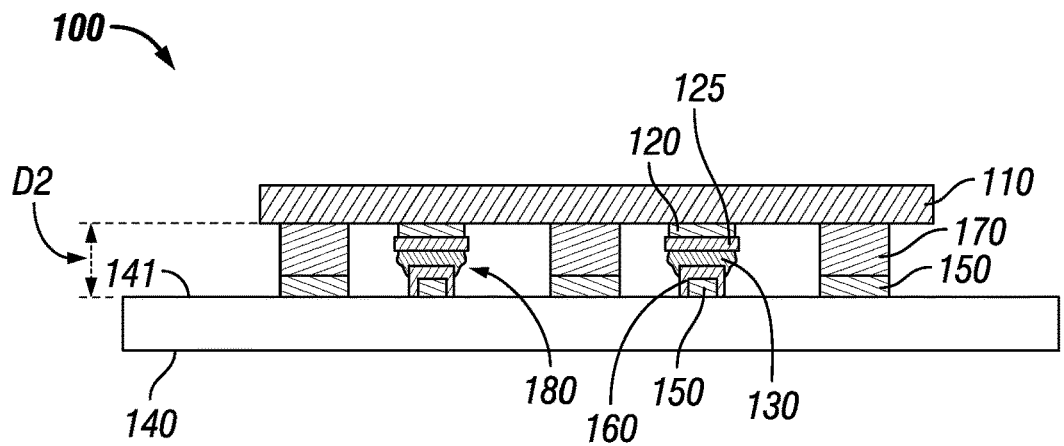
FIG. 3 is a schematic of the semiconductor device assembly of FIG. 1 with the semiconductor device positioned a second distance away from the substrate.

FIG. 1 shows a schematic of a semiconductor device assembly 100 comprised of a semiconductor device 110 and a substrate 140. FIG. 1 shows that semiconductor device 110 is positioned adjacent to the substrate 140 prior to connecting the semiconductor device 110 to the substrate 140. The semiconductor device 110 includes pillars 120 that extend from the semiconductor device 110 towards the substrate 140. The pillars 120 include plating 125 and solder bumps 130 that will be used to make electrical interconnects 180 (as shown in FIG. 3) between the semiconductor device 110 and the substrate 140. For example, the solder bumps 130 may be heated to bond to pads 160 on the top surface 141 of the substrate 140. Pads 160 may be connected to electrical traces 150 of the substrate 140 as would be appreciated by one of ordinary skill in the art having the benefit of this disclosure. The top surface 141 of the substrate 140 includes a plurality of discrete solder mask standoffs 170. The discrete solder mask standoffs 170 may be strategically positioned in a predetermined pattern on the top surface 141 of the substrate to support the semiconductor device 110 when bonded to the substrate 140 to form the semiconductor device assembly 100 as described herein.

The plurality of discrete solder mask standoffs 170 may be positioned on top of electrical traces 150 of the substrate 140. The electrical trace 150 underneath the solder mask standoff 170 may be electrically isolated and used just for the solder mask standoff 170. Alternatively, the electrical trace 150 may be electrically connected to other traces 150 on the substrate 140. Alternatively, the solder mask standoff 170 may be positioned directly to the top surface 141 of the substrate 140 to provide a desired bond line. The solder mask standoffs 170 may comprise various cross-sectional shapes. For example, the horizontal cross-sectional shape of the solder mask standoffs 170 may be square, rectangular, triangular, hexagonal, octagonal, or various other shapes. The horizontal cross-sectional shape of the solder mask standoffs 170 may have other shapes, such as but not limited, circular, elliptical, or other various shapes as would be appreciated by one of ordinary skill in the art having the benefit of this disclosure. The solder mask standoffs 170 have a height, h, that is used to support the semiconductor device 110 when bonded to the substrate 140. The solder mask standoffs 170 may have a height of approximately 15 microns on top of an electrical trace 150 having a height of 15 microns, for a total height of 30 microns, which is a typical thickness for the solder mask. The height, h, of the solder mask standoffs 170 may be much smaller or larger than the typical thickness of solder masks used on substrates. For example, the height, or in other words the thickness, of the solder mask standoffs 170 may vary between 5 microns and 100 microns depending on the application.

Figure 2:
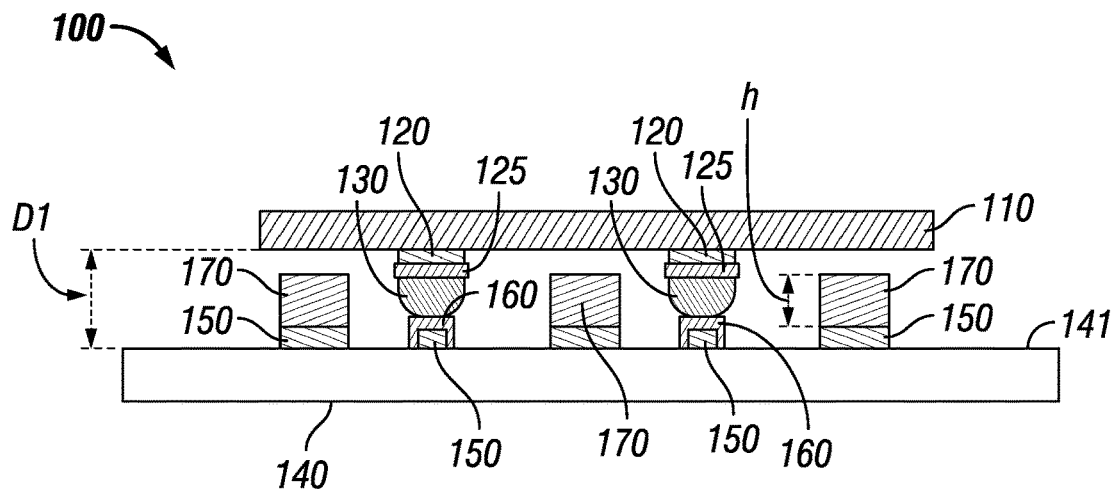
FIG. 2 is a schematic of the semiconductor device assembly of FIG. 1 with the semiconductor device positioned a first distance away from the substrate.

FIG. 2 is a schematic showing the solder bumps 130 of the semiconductor device 110 positioned on the pads 160 of the substrate 140 with the semiconductor device 110 being a first distance, D1, from the top surface 141 of the substrate 140. A TCB process may then be used to bond the semiconductor device 110 to the substrate 140. Force and heat are applied to bond the semiconductor device 110 to the substrate 140 during the TCB process as would be appreciated by one of ordinary skill in the art.

During the TCB process the solder bumps 130 of the semiconductor device 110 deform (i.e., melt) and bond to the pads 160 of the substrate 140 to create interconnects 180 between the semiconductor device 110 and the substrate 140 as shown in FIG. 3. The distance, D2, between the semiconductor device 110 and the top of the substrate 140 is less than the distance, D1, prior to the TCB process. The plurality of discrete solder mask standoffs 170 support the semiconductor device 110 as it is pressed down to the substrate 140 during the TCB process. The thickness, h, of the solder mask standoffs 170 may permit a higher force to be applied to the die 110 during the TCB process. Increasing the force applied during the bonding process may help to eliminate WLUF voids. As discussed above, while increasing the force applied during the bonding processes helps to reduce voids, it also causes solder to be squeezed out between a semiconductor device and a substrate potentially causing unwanted bridging. The use of a plurality of discrete solder mask standoffs 170 as opposed to the traditional solder mask 245 (shown in FIG. 6) reduces the likelihood of unwanted bridging even when higher forces are applied during the bonding process.

As discussed above, the force applied during the TCB process of a semiconductor device and a substrate may need to be varied to obtain a desired bond line, as the NCF becomes less viscous during the TCB process due to heating of the NCF material. The varying of force during the process may adversely affect the consistency in achieving a desired bond line between the semiconductor device and the substrate. The use of a plurality of discrete solder mask standoffs 170 to support the semiconductor device 110 on the substrate 140 provides standoffs, in other words a hard stop, that may permit a sufficiently high force to be used during the TCB process. In other words, the plurality of discrete solder mask standoffs 170 may permit a higher force to be applied during the entire TCB process, even when the viscosity of the NCF material becomes less viscous due to heating during the TCB process. The application of a constituent force in conjunction with the plurality of discrete solder mask standoffs 170 may permit a more consistent, targeted bond line between the semiconductor device 110 and the substrate 140.

Figure 6:
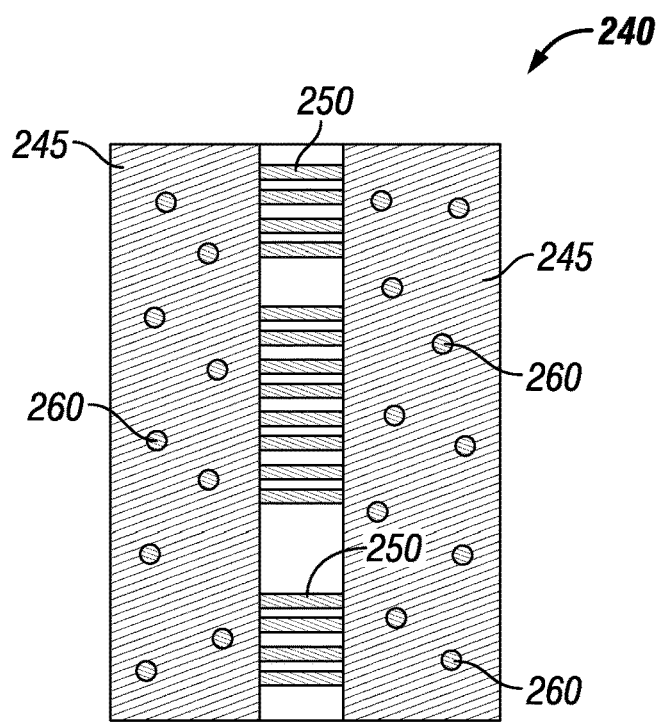
FIG. 6 is a schematic of a prior art substrate for a semiconductor device assembly having a solder mask.

The discrete solder mask standoffs 170 provide support to the semiconductor device 110 and also creates less topography on the surface of the substrate 140 in comparison to the solder mask 245 on typical substrates 240 of prior semiconductor device assemblies as the solder mask 245 generally covers a large portion of the surface of the substrate 240, as shown in FIG. 6. Typically, the solder mask 245 covers more than 75% of the surface of the substrate 240. The prior substrates 240 typically includes a substrate mask 245 that covers the entire substrate 240 except for a plurality of outrigger pads 260 and a middle channel with exposed having live traces 250, as shown in FIG. 6. The use of a plurality of discrete solder mask standoffs 170 permits better support for a semiconductor device 110, which may provide for a more consistent bond line between the semiconductor 110 and the substrate 140. As discussed above, the plurality of discrete solder mask standoffs 170 may provide for a more consistent target bond line between the semiconductor 110 and the substrate 140 by permitting a substantially constant force to be applied during the bonding process.

Figure 4A:
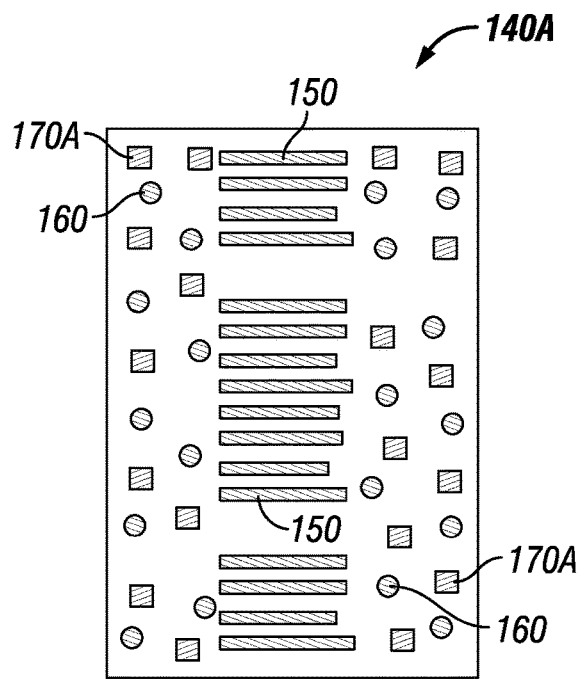
FIGS. 4A-4E are schematics of various embodiments of a substrate having a predetermined pattern of a plurality of discrete solder mask standoffs.

FIG. 4A is a schematic of an embodiment of a substrate 140A having a plurality of discrete solder mask standoffs 170A that are positioned in a predetermined pattern on the surface of the substrate 140A. The substrate 140A includes a plurality of outrigger pads 160, which may be optional. The substrate 140A includes a plurality of exposed live traces 150 along the middle of the substrate 140A that correspond to the exposed live traces 250 of the substrate 240 shown in FIG. 6. The exposed live traces 150, 250 may have the same metal structure as pads 160, 260 as would be appreciated by one of ordinary skill in the art. In other words, the exposed live traces 150, 250 may be a trace covered by a pad. Likewise, the outlaying pads 160, 260 may be pads positioned on electrical traces that are positioned away from the exposed portion in the middle of the substrate. The substrate 140A includes additional traces 150 that are normally covered by the solder mask 245 (shown in FIG. 6), but have not been shown on substrate 140A for clarity. Likewise, the traces 150 normally covered by the conventional solder mask are not shown in FIGS. 4B-4E for clarity.

Figure 4B:
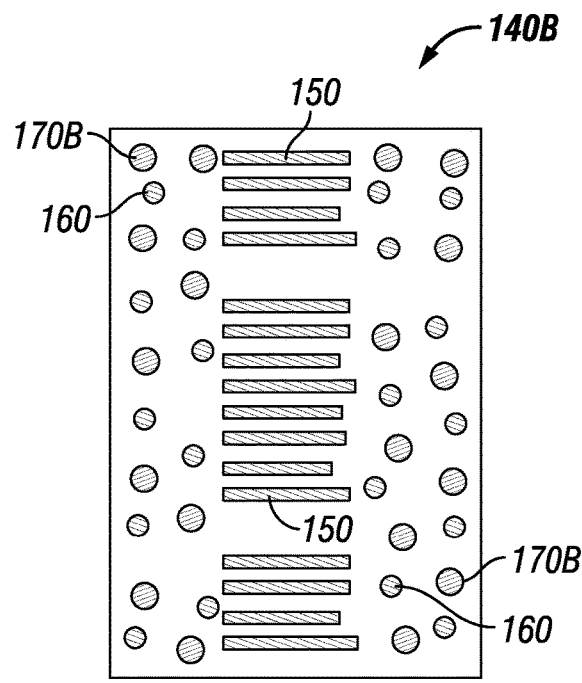
Figure 4C:
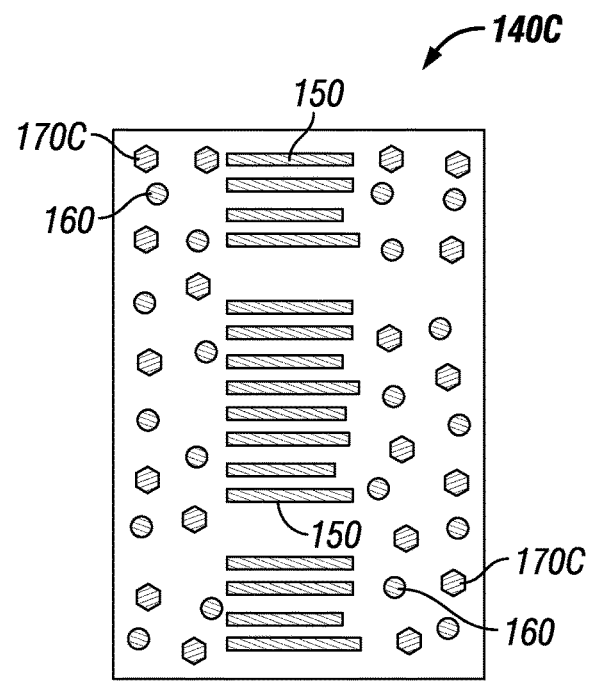

The plurality of discrete solder mask standoffs 170A may be conveniently and/or strategically located about the substrate 140A to provide adequate support to a semiconductor device 110 (shown in FIGS. 1-3) as it is bonded to the substrate 140A. The shape, location, and/or thickness of the solder mask standoffs 170A may varied depending on the application as would be appreciated by one of ordinary skill in the art having the benefit of this disclosure. For example, but not limited to, the solder mask standoffs 170A may have a square cross-sectional shape as shown in FIG. 4A, the solder mask standoffs 170B may have a circular cross-sectional shape as shown in FIG. 4B, or the solder mask standoffs 170C may have a hexagonal cross-sectional shape as shown in FIG. 4C. The discrete solder mask standoffs may also comprise various other shapes. Additionally, the discrete solder mask standoffs may be comprised of more than one shape on a substrate 140 as would be appreciated by one of ordinary skill in the art having the benefit of this disclosure.

Figure 4D:
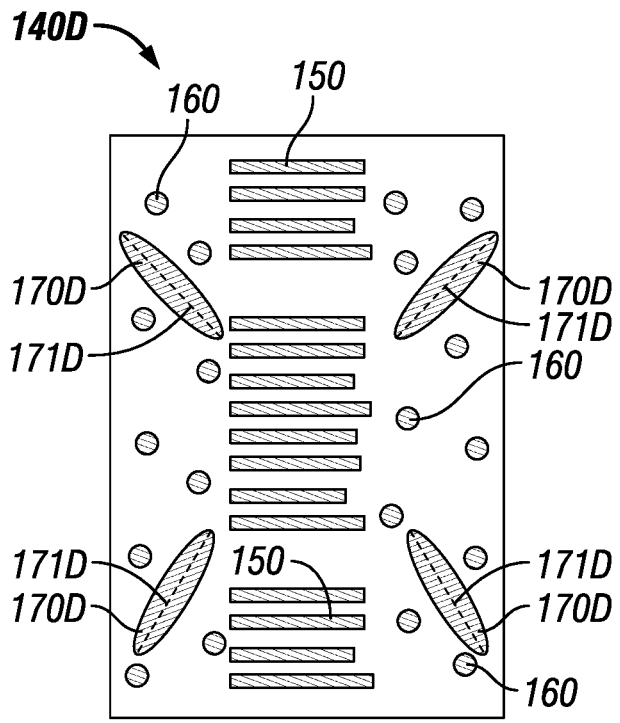
Figure 4E:
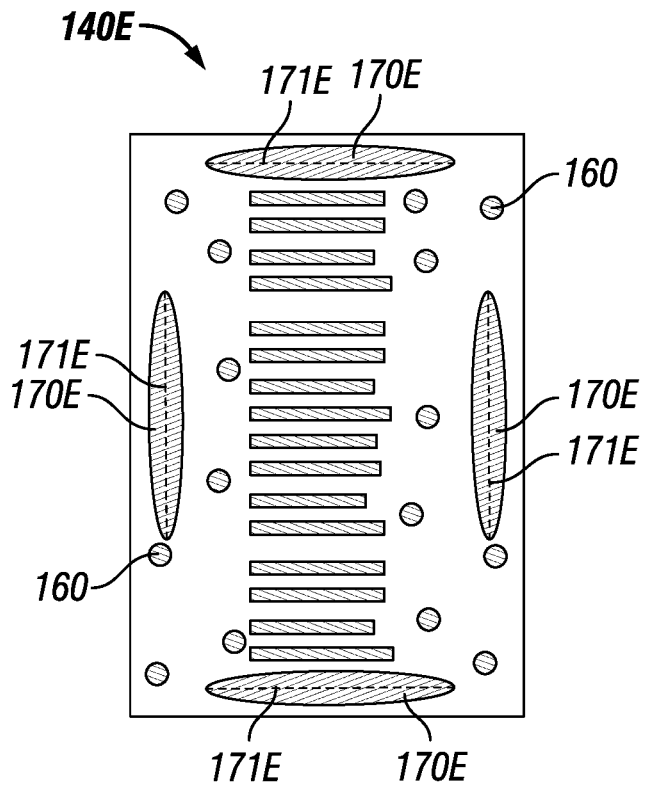
Figure 5:
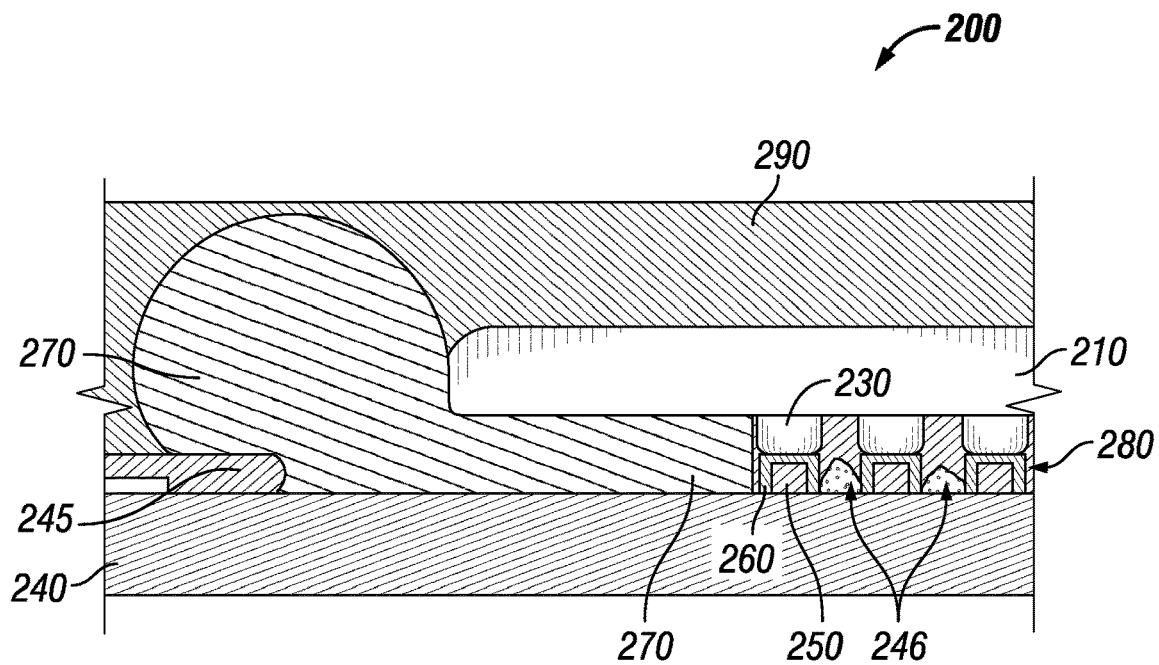
FIG. 5 is a schematic of a prior art semiconductor device assembly having voids in the solder mask.

The location, number, pattern, and/or shape of the solder mask standoffs 170 may be conveniently and/or strategically varied as would be appreciated by one of ordinary skill in the art having the benefit of this disclosure. For example, elongated solder mask standoffs 170D shown in FIG. 4D and elongated solder mask standoffs 170E shown in FIG. 4E may be used to protect potentially sensitive areas of the semiconductor device and/or substrate from the flow of NCF during the bonding process. The elongated solder mask standoffs may have various shapes depending on the application as would be appreciated by one of ordinary skill in the art having the benefit of this disclosure. In one example, the elongated solder mask standoffs may be generally elliptical in shape having a major axis 171D, 171E as shown in FIGS. 4D and 4E. The major axis 171D, 171E of the elongated solder mask standoffs may be used to direct the flow of NCF during the bonding process as it moves through the bond line.

For example, the major axis 171D of an elongated solder mask standoff 170D may be arranged to be angled with respect to the edges of the substrate 140D. The major axis 171D of an elongated solder mask standoff 170D may be angled at substantially 45 degrees with respect to an edge of the substrate 140D protect the corners sensitive areas of the semiconductor device and/or direct the flow of any melted solder. Likewise, the major axis 171E of elongated solder mask standoffs 170E may be positioned to be substantially aligned with an edge of the substrate 140E to protect a sensitive area of the semiconductor device and/or substrate and/or direct the flow of NCF during the bonding process as shown in FIG. 4E. The substantially elliptical shapes shown in FIGS. 4D and 4E are for illustrative purposes only. Various other patterns, elongated shapes, orientations, and/ or configurations may be used to protect particularly sensitive areas of a semiconductor and/or direct the potential flow of NCF as would be appreciated by one of ordinary skill in the art having the benefit of this disclosure.

As illustrated in FIGS. 4A-4E, the discrete solder mask standoffs may cover much less of the surface of the substrate 140 as compared to traditional solder masks used during the bonding of a semiconductor device 110 to a substrate 140. For example, a traditional solder mask may cover more than 75% of the surface of a substrate 240 (as shown in FIG. 6). Discrete solder mask standoffs of the present disclosure may comprise of various shapes, patterns, and/or configurations and may cover 50% or less of the surface of a substrate 140. In some embodiments, the discrete solder mask standoffs may cover less than 25% of a substrate 140 depending on the application as would be appreciated by one of ordinary skill in the art having the benefit of this disclosure.

Figure 7:
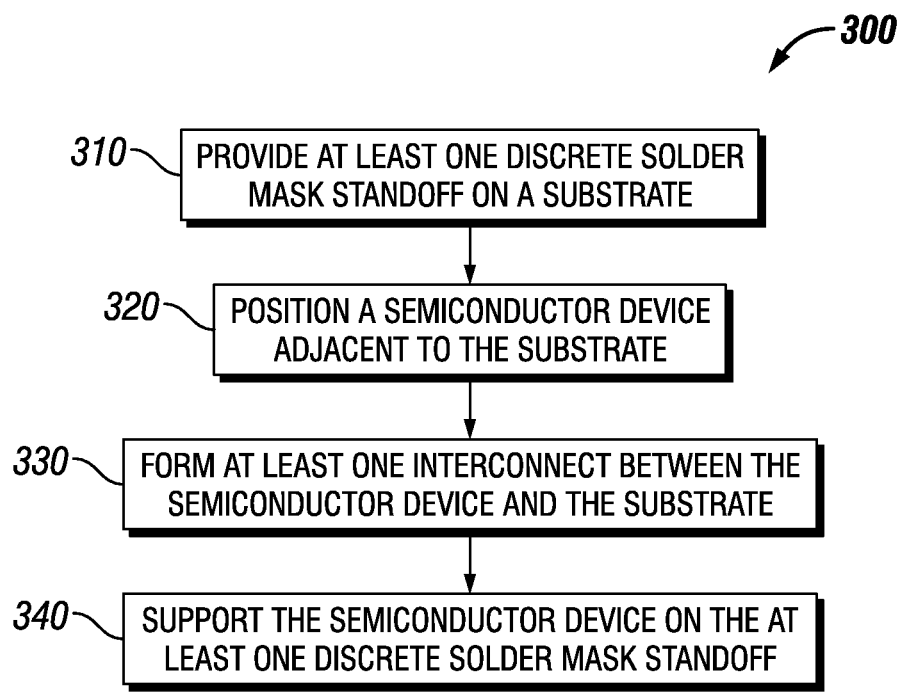
FIG. 7 is a flow chart depicting one embodiment of a method of making a semiconductor device assembly.

FIG. 7 is flow chart of one embodiment of method of making a semiconductor device assembly 300 that includes providing at least one discrete solder mask standoff on a substrate, at step 310. At step 320, the method 300 includes positioning a semiconductor device adjacent to the substrate. The method 300 includes forming at least one interconnect between the semiconductor device and the substrate, at step 330. The semiconductor device is supported on at least one discrete solder mask standoff, at step 340. Forming the interconnect may comprise of connecting at least one pillar to at least one trace on the substrate. The pillar may be connected to the trace by using a force controlled TCB process. During the TCB process, the semiconductor device and the substrate may move together so that the semiconductor device contacts at least one discrete solder mask standoff on the substrate. The substrate may include a plurality of discrete solder mask standoffs that support the semiconductor device during the TCB process. At least one outrigger pad may be provided on the substrate and the interconnect may be made between the semiconductor device and the at least one outrigger pad.

Figure 8:
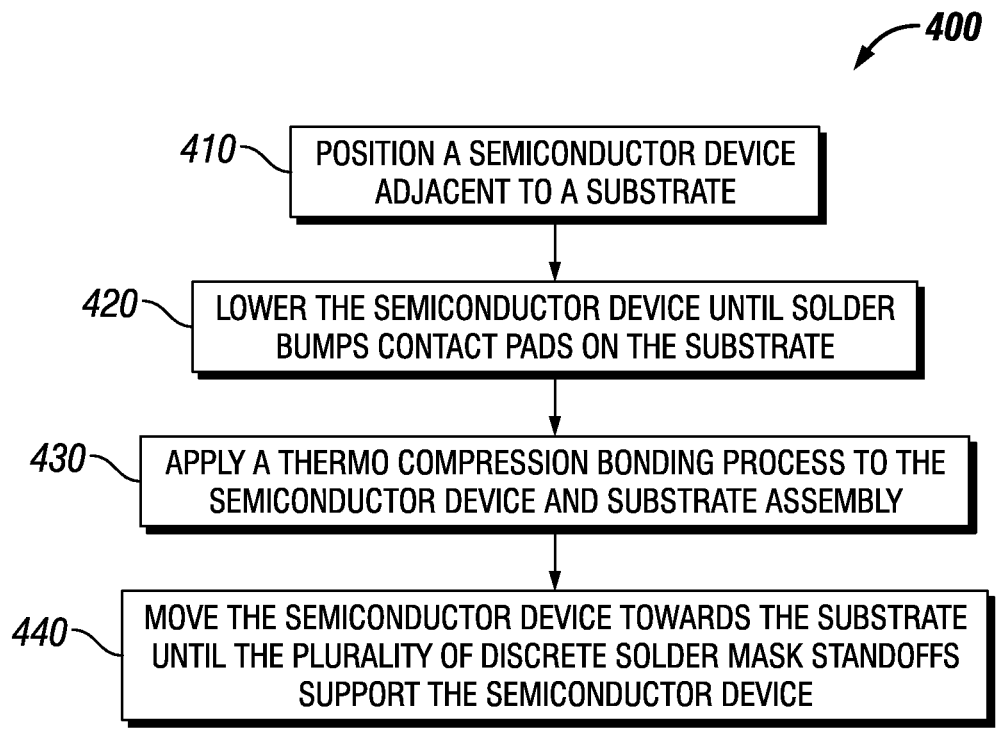
FIG. 8 is a flow chart depicting one embodiment of a method of making a semiconductor device assembly.

FIG. 8 is flow chart of one embodiment of method of making a semiconductor device assembly 400 that includes positioning a semiconductor device adjacent to a substrate, at step 410. The substrate includes a plurality of discrete solder mask standoffs that extend from the top surface towards the semiconductor device. The semiconductor device includes a plurality of pillars that extend toward the substrate with a solder bump located on the end of each pillar. The method 400 includes lowering the semiconductor device until the solder bumps contact a pad on the substrate, at step 420. The bottom surface of the semiconductor device will be at a first distance from the top surface of the substrate. At step 430, the method 400 includes applying a TCB process to the semiconductor device and substrate assembly. The TCB process melts the solder bumps to form interconnects with the pads. The method 400 includes moving the semiconductor device towards the substrate until the plurality of discrete solder mask standoffs support the semiconductor device, at which the bottom surface of the semiconductor device will be at a second distance from the top surface of the substrate. The second distance is less than the first distance. The method 400 may include providing that the plurality of discrete solder mask standoffs are elongated in shape or are a polygonal shape. The solder mask stands may be located on a trace on the top surface of the substrate.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A method of making a semiconductor device assembly comprising:
    positioning a semiconductor device adjacent to the substrate, the substrate having a plurality of discrete solder mask standoffs that extend from a top surface towards the semiconductor device, the semiconductor device having a plurality of pillars that extend towards the substrate, each pillar including a solder bump on an end of each pillar of the plurality of pillars;
    lowering the semiconductor device until each solder bump contacts a respective pad on the substrate, wherein a bottom surface of the semiconductor device is a first distance from the top surface of the substrate;
    applying a thermo compression bonding process to the semiconductor device and substrate assembly, wherein the solder bumps melt to form interconnects with the respective pads; and
    moving the semiconductor device towards the substrate until the plurality of discrete solder mask standoffs support the semiconductor device on the top surface of the substrate, wherein the bottom surface of the semiconductor device is a second distance from the top surface of the substrate, the second distance being less than the first distance.

2. The method of claim 1, further comprising providing that the plurality of discrete solder mask standoffs are elongated in shape.

3. The method of claim 1, further comprising providing that the plurality of discrete solder mask standoffs are a polygonal shape and are located on a trace on the top surface of the substrate.

4. The method of claim 1, wherein at the first distance there is a gap between the semiconductor device and each of the plurality of discrete solder mask standoffs.

5. The method of claim 4, further comprising providing the plurality of discrete solder mask standoffs on electrical traces on the substrate.

6. The method of claim 5, further comprising electrically isolating the electrical traces positioned underneath the plurality of discrete solder mask standoffs.

7. The method of claim 2, wherein the at least one pad is connected to an electrical trace.

8. The method of claim 1, wherein at the first distance the at least one discrete solder mask standoff does not contact the semiconductor device.

9. The method of claim 1, wherein providing the at least one discrete solder mask standoff on the substrate further comprises providing the at least one discrete solder mask standoff on an electrical trace on the substrate.

10. The method of claim 9, further comprising providing that the electrical trace is isolated.

11. The method of claim 9, further comprising providing that the electrical trace is electrically connected to other electrical traces on the substrate.

12. A method of making a semiconductor device assembly comprising:
    positioning a semiconductor device adjacent to a substrate, the substrate having a plurality of discrete solder mask standoffs that extend from a top surface towards the semiconductor device, the semiconductor device having a plurality of pillars that extend towards the substrate, each pillar including a solder bump on an end of each pillar;

lowering the semiconductor device until each solder bump contacts a respective pad on the substrate;

applying a thermo compression bonding process to the semiconductor device and substrate assembly, the thermo compression bonding process applying a force to move the semiconductor device toward the substrate, wherein the solder bumps melt to form interconnects with the respective pads; and preventing solder bridging by supporting the semiconductor device on the top surface of the substrate with the plurality of discrete solder mask standoffs supporting the semiconductor device on the top surface of the substrate, the plurality of discrete solder mask standoffs preventing the end of each pillar from contacting the respective pad.

13. The method of claim 12, wherein each of the plurality of pillars comprises plating positioned between the end of the pillar and the solder bump.

14. The method of claim 13, the plurality of discrete solder mask standoffs preventing the plating of each pillar of the plurality of pillars from contacting the respective pad.

* * * * *